US009183923B2

(12) United States Patent
Yamagami et al.

(10) Patent No.: US 9,183,923 B2
(45) Date of Patent: Nov. 10, 2015

(54) SEMICONDUCTOR STORAGE DEVICE

(71) Applicant: PANASONIC CORPORATION, Osaka (JP)

(72) Inventors: Yoshinobu Yamagami, Osaka (JP); Makoto Kojima, Osaka (JP); Katsuji Satomi, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 14/172,636

(22) Filed: Feb. 4, 2014

(65) Prior Publication Data

US 2014/0153320 A1  Jun. 5, 2014

Related U.S. Application Data

(63) Continuation of application No. PCT/JP2012/005632, filed on Sep. 5, 2012.

(30) Foreign Application Priority Data

Dec. 8, 2011  (JP) .................................. 2011-269305

(51) Int. Cl.
  *G11C 11/00* (2006.01)
  *G11C 11/417* (2006.01)
  *G11C 11/413* (2006.01)
  *G11C 11/419* (2006.01)

(52) U.S. Cl.
  CPC ............ *G11C 11/417* (2013.01); *G11C 11/413* (2013.01); *G11C 11/419* (2013.01)

(58) Field of Classification Search
  CPC .... G11C 11/419; G11C 5/063; G11C 11/417; G11C 5/14; G11C 5/147; G11C 16/12; G11C 16/30; G11C 2207/2227; G11C 8/16
  See application file for complete search history.

(56) References Cited

U.S. PATENT DOCUMENTS

2006/0028896 A1*  2/2006  Yamagami .................... 365/226
2006/0056229 A1   3/2006  Maeda et al.
(Continued)

FOREIGN PATENT DOCUMENTS

| JP | 2006-073165 A | 3/2006 |
| JP | 2006-085786 A | 3/2006 |
| JP | 2007-012214 A | 1/2007 |

(Continued)

OTHER PUBLICATIONS

International Search Report issued in PCT/JP2012/005632, dated Dec. 11, 2012, with English translation, 4 pages.

*Primary Examiner* — Thong Q Le
(74) *Attorney, Agent, or Firm* — McDermott Will & Emery LLP

(57) ABSTRACT

A memory cell power supply circuit for each column includes a first PMOS transistor and a second PMOS transistor connected together in series between a first power supply and a second power supply. A connection point between the first and second PMOS transistors is output as a memory cell power supply. A control signal which is based on a column select signal and a write control signal is input to a gate terminal of the first PMOS transistor. A signal which is an inverted version of the signal input to the gate terminal of the first PMOS transistor is input to a gate terminal of the second PMOS transistor.

19 Claims, 7 Drawing Sheets

(56) References Cited

U.S. PATENT DOCUMENTS

2007/0002662 A1 1/2007 Yamagami et al.
2007/0206404 A1* 9/2007 Yamagami .................. 365/154
2009/0135662 A1 5/2009 Akiyoshi
2011/0103126 A1 5/2011 Satomi et al.

FOREIGN PATENT DOCUMENTS

| JP | 2007-234126 A | 9/2007 |
| JP | 2009-134779 A | 6/2009 |
| WO | 2010-013449 A1 | 2/2010 |

* cited by examiner

SEMICONDUCTOR STORAGE DEVICE

CROSS-REFERENCE TO RELATED APPLICATIONS

This is a continuation of International Application No. PCT/JP2012/005632 filed on Sep. 5, 2012, which claims priority to Japanese Patent Application No. 2011-269305 filed on Dec. 8, 2011. The entire disclosures of these applications are incorporated by reference herein.

BACKGROUND

The present disclosure relates to techniques of controlling a power supply voltage for a memory cell in semiconductor storage devices, such as static random access memory (SRAM) etc.

Advances in miniaturization of semiconductor devices in recent years have been accompanied by an increase in variations in characteristics of transistors included in semiconductor storage devices. The power supply voltage in semiconductor storage devices has been increasingly reduced.

In the background art, the memory cell power supply voltage may be decreased on the row-by-row basis in order to reduce the leakage current of a memory cell. Specifically, a high power supply voltage for memory cells in non-selected rows may be controlled to a voltage value lower than the VDD level (see Japanese Unexamined Patent Publication No. 2006-73165).

Alternatively, in the background art, the memory cell power supply voltage may be decreased on the column-by-column basis in order to increase the write margin of a memory cell while ensuring a sufficient margin for static noise. Specifically, a high power supply voltage for memory cells in a selected column during data write operation may be controlled to a voltage value lower than the VDD level (see Japanese Unexamined Patent Publication Nos. 2006-85786 and 2007-12214).

Alternatively, in the background art, a low power supply voltage for memory cells in a selected column during data write operation may be controlled to a voltage value higher than the VSS level (see Japanese Unexamined Patent Publication No. 2007-234126).

In the technique of Japanese Unexamined Patent Publication No. 2006-85786 supra, no means is provided for supplying charge to the memory cell power supply after the memory cell power supply is decreased during write operation. As a result, the memory cell power supply voltage gradually decreases due to a leakage current. Therefore, during write operation, the memory cell power supply becomes lower than the retention voltage of a memory cell, leading to a problem that data stored or held in memory cells other than those to be written which are connected to the memory cell power supply is destroyed.

In the technique of Japanese Unexamined Patent Publication No. 2007-12214 supra, a voltage lower than the power supply voltage is generated by voltage division performed using two p-type MOS (PMOS) transistors which are connected together in series between the power supply and the ground. However, during write operation, both of the two PMOS transistors are on, and therefore, a through current flows from the power supply to the ground through the memory cell power supply generating portion, resulting in an increase in power consumption.

SUMMARY

The present disclosure describes implementations of a semiconductor storage device in which when the memory cell power supply is reduced during write operation to improve write characteristics of memory cells, a current consumed by the memory cell power supply generating portion is reduced, and moreover, the memory cell power supply does not become lower than the memory cell retention voltage, and therefore, data in memory cells is not destroyed.

A first semiconductor storage device of the present disclosure includes a plurality of word lines, a plurality of bit lines, a plurality of memory cells provided at intersections of the plurality of word lines and the plurality of bit lines, and a plurality of memory cell power supply circuits each configured to supply a same memory cell power supply to a subset of the plurality of memory cells which is connected to a same one of the plurality of bit lines. The plurality of memory cell power supply circuits each include a first and a second PMOS transistor connected together in series between a first and a second power supply. A connection point between the first and second PMOS transistors is output as the memory cell power supply. A control signal which is based on a column select signal and a write control signal is input to a gate terminal of the first PMOS transistor. A logically inverted version of the signal input to the gate terminal of the first PMOS transistor is input to a gate terminal of the second PMOS transistor. The absolute value of the threshold voltage of the second PMOS transistor is set to be larger than the absolute values of the threshold voltages of a load transistor and a drive transistor of the memory cell.

A second semiconductor storage device of the present disclosure includes a plurality of word lines, a plurality of bit lines, a plurality of memory cells provided at intersections of the plurality of word lines and the plurality of bit lines, and a plurality of memory cell power supply circuits each configured to supply a same memory cell power supply to a subset of the plurality of memory cells which is connected to a same one of the plurality of bit lines. The plurality of memory cell power supply circuits each include a first and a second PMOS transistor and a first NMOS transistor connected together in series between a first and a second power supply. A connection point between the first and second PMOS transistors is output as the memory cell power supply. A control signal which is based on a column select signal and a write control signal is input to a gate terminal of the first PMOS transistor and a gate terminal of the first NMOS transistor. A drain terminal of the first NMOS transistor is connected to a gate terminal of the second PMOS transistor.

A third semiconductor storage device of the present disclosure includes a plurality of word lines, a plurality of bit lines, a plurality of memory cells provided at intersections of the plurality of word lines and the plurality of bit lines, and a plurality of memory cell power supply circuits each configured to supply a same memory cell power supply to a subset of the plurality of memory cells which is connected to a same bit line. The plurality of memory cell power supply circuits each include a first and a second PMOS transistor connected together in series between a first and a second power supply. A connection point between the first and second PMOS transistors is output as the memory cell power supply. A control signal which is based on a write control signal, but not based on a column select signal, is input to a gate terminal of the first PMOS transistor. A control signal which is based on the column select signal and the write control signal is input to a gate terminal of the second PMOS transistor.

A fourth semiconductor storage device of the present disclosure includes a plurality of word lines, a plurality of bit lines, a plurality of memory cells provided at intersections of the plurality of word lines and the plurality of bit lines, and a plurality of memory cell power supply circuits each configured to supply a same memory cell power supply to a subset of the plurality of memory cells which is connected to a same bit line. The plurality of memory cell power supply circuits each have a function of causing, during write operation, the potential of the memory cell power supply to be lower than the potential of the first power supply. The semiconductor storage device further includes a leakage current compensation circuit including a MOS transistor connected between the first power supply and the memory cell power supply, and configured to compensate for a leakage current of the memory cell power supply while the potential of the memory cell power supply is caused to be lower than the potential of the first power supply.

As described above, in the semiconductor storage device of the present disclosure, the write characteristics of a memory cell during write operation can be improved with low power consumption. Moreover, compared to the conventional art, the memory cell power supply does not become lower than the retention voltage of a memory cell, and therefore, data in a memory cell is not destroyed and can be reliably stored or held.

DETAILED DESCRIPTION

Figure 1:
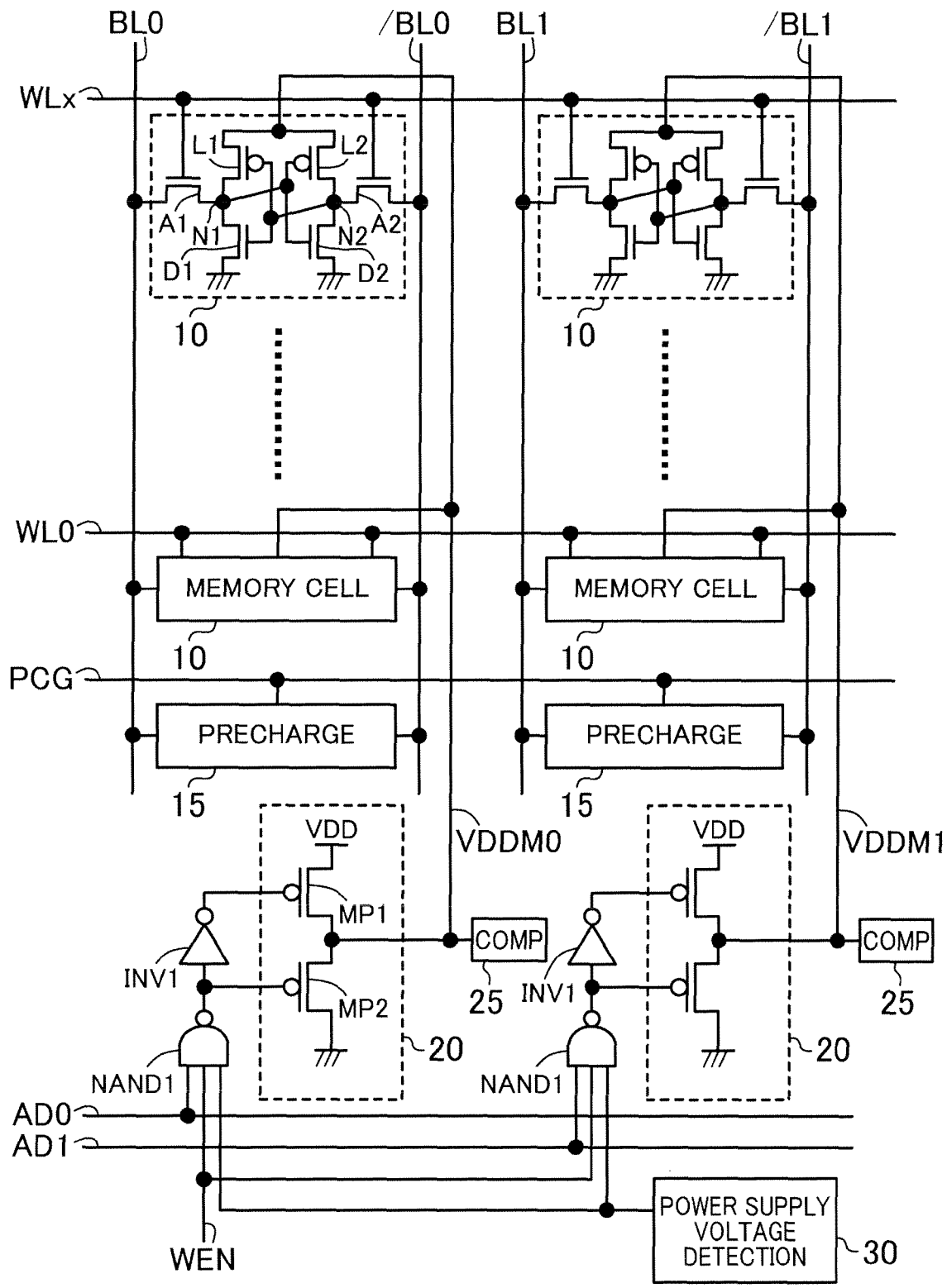
FIG. 1 is a circuit diagram showing a configuration of a semiconductor storage device according to a first embodiment of the present disclosure.

Embodiments of the present disclosure will now be described in detail with reference to the accompanying drawings. Note that like parts are indicated by like reference characters throughout the specification and will not be redundantly described.

First Embodiment

FIG. 1 is a diagram of a configuration of a semiconductor storage device according to a first embodiment of the present disclosure. The semiconductor storage device of FIG. 1 includes: memory cells 10 each of which includes access transistors A1 and A2, drive transistors D1 and D2, and load transistors L1 and L2, which are arranged to provide two storage nodes N1 and N2; bit line precharge circuits 15; memory cell power supply circuits 20 each of which includes PMOS transistors MP1 and MP2; leakage current compensation circuits 25; a power supply voltage detection circuit 30; inverter circuits INV1; and NAND circuits NAND1. Reference characters WL0-WLx indicate word lines. Reference characters BL0, BL1, /BL0, and /BL1 indicate bit lines. A reference character PCG indicates a precharge control signal. Reference characters VDDM0 and VDDM1 indicate memory cell power supplies. Reference characters AD0 and AD1 indicate column address signals. A reference character WEN indicates a write control signal. A reference character VDD indicates a power supply (first power supply). The suffix "x" in "WLx" indicates an integer of at least one. This means that, in FIG. 1, there are a plurality of memory cells 10 connected to the plurality of word lines W0-WLx.

Each of the word lines W0-WLx is connected to gate terminals of the access transistors A1 and A2 of the corresponding memory cells 10. Each of the bit lines BL0, BL1, /BL0, and /BL1 is connected to drain terminals of the access transistors A1 or A2 of the corresponding memory cells 10. The same memory cell power supply (VDDM0 or VDDM1) is connected to source terminals of the load transistors L1 and L2 of the memory cells 10 connected to the same pair of bit lines (BL0 and /BL0 or BL1 and /BL1).

In the memory cell 10, a pair of the load transistor L1 and the drive transistor D1 and a pair of the load transistor L2 and the drive transistor D2 form respective inverters. An output terminal of each inverter is connected to an input terminal of the other inverter to form a flip-flop. The flip-flop can store or hold data. The gate terminals of the access transistors A1 and A2 are connected to a corresponding one of the word lines W0-WLx, and the drain terminals thereof are connected to the bit lines BL0 or BL1 and /BL0 or /BL1, respectively. The source terminals of the access transistors A1 and A2 are connected to the input and output terminals of the inverters.

The memory cell power supply circuit 20 includes PMOS transistors MP1 and MP2 which are connected together in series between the power supply VDD and the ground power supply. The memory cell power supply VDDM0 or VDDM1 is output from a connection point between the PMOS transistors MP1 and MP2. An output signal of the NAND circuit NAND1, which receives the column address signal AD0 (or AD1), the write control signal WEN, and an output of the power supply voltage detection circuit 30, is connected to a gate terminal of the PMOS transistor MP2 included in the memory cell power supply circuit 20. An output signal of the inverter circuit INV1, which receives the output signal of the NAND circuit NAND1, is connected to a gate terminal of the PMOS transistor MP1.

Figure 2:
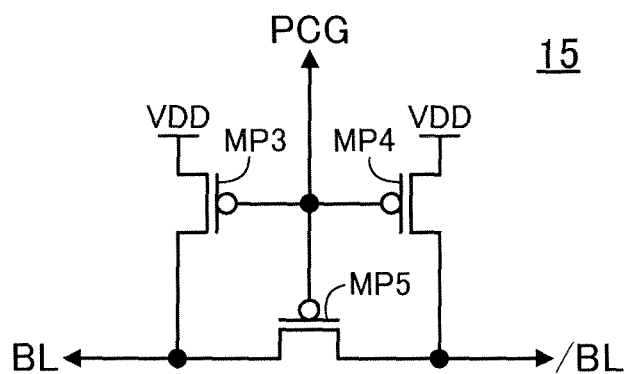
FIG. 2 is a circuit diagram showing an example detailed configuration of a bit line precharge circuit of FIG. 1.

FIG. 2 is a circuit diagram showing an example detailed configuration of the bit line precharge circuit 15 of FIG. 1. The bit line precharge circuit 15 includes three PMOS transistors MP3, MP4, and MP5 which receive the precharge control signal PCG at gate terminals thereof and are provided between the power supply VDD and each of the bit lines BL and /BL and between the bit lines BL and /BL.

Figure 3:
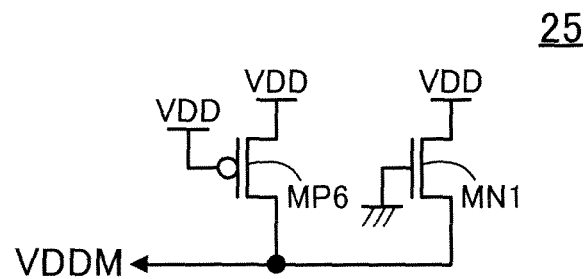
FIG. 3 is a circuit diagram showing an example detailed configuration of a leakage current compensation circuit of FIG. 1.

FIG. 3 is a circuit diagram showing an example detailed configuration of the leakage current compensation circuit 25 of FIG. 1. As shown in FIG. 3, the leakage current compensation circuit 25 includes a PMOS transistor MP6 and an n-type MOS (NMOS) transistor MN1. A source terminal and a gate terminal of the PMOS transistor MP6 are connected to the power supply VDD, and a drain terminal thereof is connected to the memory cell power supply VDDM. A source terminal of the NMOS transistor MN1 is connected to the power supply VDD, a gate terminal thereof is connected to the ground power supply, and a drain terminal thereof is connected to the memory cell power supply VDDM. In FIG. 3, the PMOS transistor MP6 and the NMOS transistor MN1 are both off.

Note that, in FIG. 1, a write circuit for transferring write data to bit lines connected to a memory cell 10 to be written based on a column address signal and a write control signal, and a read circuit for reading data from a memory cell 10 are not shown for the sake of simplicity. It is assumed that when write data is transferred to the bit lines BL0 and /BL0, the write circuit is controlled based on a signal which is based on the column address signal AD0 and the write control signal WEN, and when write data is transferred to the bit lines BL1 and /BL1, the write circuit is controlled based on a signal which is based on the column address signal AD1 and the write control signal WEN.

Operation of the semiconductor storage device of this embodiment thus configured will now be described.

The potential of one of the bit lines BL and /BL which are connected to a memory cell 10 and have been precharged high by the bit line precharge circuit 15 is changed from high to low, and the word line is changed from low to high (active), so that data is written to the memory cell 10. The potential of one of the bit lines BL and /BL which have been precharged high by the bit line precharge circuit 15 is changed from high to low, based on a state stored or held by the flip-flop in a memory cell 10, by changing the word line to the active state, so that data is read from the memory cell 10. When the word line is low (inactive), the access transistors A1 and A2 are both off, and therefore, if the memory cell power supply VDDM0 and VDDM1 continue to be supplied, data stored in the flip-flop is not affected by external factors, i.e., the flip-flop continues to store or hold the same data.

Next, data write operation will be described in greater detail. Here, a case where data is written to a memory cell 10 connected to the word line WLx and the bit lines BL0 and /BL0 (the upper left memory cell of FIG. 1) will be described as an example. It is assumed that the memory cell 10 stores data which is obtained when the source terminal of the access transistor A1 is high (the source terminal of the access transistor A2 is low). It is also assumed that the output of the power supply voltage detection circuit 30 is high.

Initially, all of the word lines are precharged low (inactive), and all of the bit lines are precharged high.

Next, one of the bit lines BL0 and /BL0 which are connected to a memory cell 10 to be written is changed from high to low. For example, the bit line BL0 is changed from high to low. In this state, the word line WLx is changed from low to high (active).

When the word line WLx goes high, the access transistor A1 (A2) is turned on. As a result, the potential state of the bit line BL0 (/BL0) is transferred via the access transistor A1 (A2) to the memory cell 10.

Because the potential state of the bit line BL0 is low, the potential of the source terminal of the access transistor A1 of the memory cell 10 goes from high to low. The source terminal of the access transistor A1 is the input of the inverter including the load transistor L2 and the drive transistor D2. Therefore, when the potential of the source terminal of the access transistor A1 exceeds the switching voltage of the inverter, the data of the memory cell 10 is inverted and therefore the data write operation is completed.

When the source terminal of the access transistor A1 is high, the load transistor L1 is on and the drive transistor D1 is off. The actual potential of the source terminal of the access transistor A1 is determined based on the current capability ratio of the access transistor A1 and the load transistor L1.

The memory cell 10 is designed so that the current capability of the access transistor is greater than the current capability of the load transistor. Therefore, when the bit line BL0 goes low, the source terminal of the access transistor A1 is allowed to go from high to low, so that the switching voltage of the inverter including the load transistor L2 and the drive transistor D2 is exceeded, and therefore, data in the memory cell 10 can be rewritten.

However, in a semiconductor storage device in which a low power supply voltage is supplied as a normal voltage, the access transistor A1 has a lower current capability, and therefore, it is difficult for the source terminal of the access transistor A1 to go low. As a result, the switching voltage of the inverter including the load transistor L2 and the drive transistor D2 cannot be exceeded, and therefore, data in the memory cell 10 cannot be rewritten.

In order to address the above problem, when data in the memory cell 10 is rewritten, the source potential (memory cell power supply) of the load transistor may be decreased so that the capability of the load transistor becomes lower than that in the normal state in which the power supply VDD level is applied to the source terminal of the load transistor.

If the source potential (memory cell power supply) of the load transistor L1 decreases, the capability of the load transistor L1 decreases. Therefore, when the word line WLx is active and the bit line BL0 is low, the source terminal of the access transistor A1 is more easily changed from high to low, and therefore, the switching voltage of the inverter including the load transistor L2 and the drive transistor D2 is more easily exceeded, and therefore, data in the memory cell 10 can be rewritten.

As described above, during write operation, if the source potential (memory cell power supply) of the load transistor is decreased, the write characteristics of the memory cell 10 are improved.

The memory cell power supply circuit 20 which generates the memory cell power supplies VDDM0 and VDDM1 is controlled based on a signal which is based on the column address signals AD0 and AD1 and the write control signal WEN.

The write control signal WEN is low (inactive), except for during write operation. Therefore, irrespective of the states of the column address signals AD0 and AD1, the NAND circuit NAND1 outputs a high-level signal, and the inverter circuit INV1 which receives the output of the NAND circuit NAND1 outputs a low-level signal. As a result, the PMOS transistors MP1 and MP2 included in the memory cell power supply circuit 20 are turned on and off, respectively, and therefore, all the memory cell power supplies VDDM0 and VDDM1 output a power supply VDD-level signal.

During write operation, when a word line becomes active, the write control signal WEN goes high (active). In this case, either of the column address signals AD0 and AD1 is high. For example, when data is written to the memory cell 10 connected to the word line WLx and the bit lines BL0 and /BL0 (the upper left memory cell of FIG. 1), the column address signals AD0 and AD1 are high and low, respectively.

Therefore, the NAND circuit NAND1 which receives the column address signal AD0 outputs a low-level signal, and the inverter circuit INV1 in the following stage outputs a high-level signal. The PMOS transistors MP1 and MP2 of the memory cell power supply circuit 20 are turned off and on, respectively, and therefore, the potential of the memory cell power supply VDDM0 decreases from the power supply VDD level to the absolute value |Vtp| of the threshold voltage of the PMOS transistor MP2. When the potential of the memory cell power supply VDDM0 becomes |Vtp|, the PMOS transistor MP2 is turned off. Because the PMOS transistors MP1 and MP2 are both turned off, a current does not flow through the memory cell power supply circuit 20.

In contrast to this, the memory cell power supply VDDM1 for memory cells 10 connected to the bit lines BL1 and /BL1 on which write operation is not performed outputs a power supply VDD-level signal because the column address signal AD1 is low. It is not necessary to decrease, from the power supply VDD level, the memory cell power supply for memory cells 10 connected to bit lines on which write operation is not performed. Although a problem does not arise even when the memory cell power supply for memory cells 10 connected to bit lines on which write operation is not performed is decreased from the power supply VDD level, an unwanted charge or discharge current occurs in the memory cell power supply. Therefore, as in the above configuration, the memory cell power supply should be controlled and fixed to the power supply VDD level based on a signal which is based on the column address signal.

As described above, during write operation, the memory cell power supply for a memory cell 10 to be written is decreased from the power supply VDD level, and therefore, the write characteristics of the memory cell 10 are improved. Also, in the memory cell power supply circuit 20 which generates the memory cell power supply, a through current which flows from the power supply VDD to the ground power supply does not occur.

However, in the above configuration, the potential of the memory cell power supply VDDM0 for a memory cell 10 connected to the bit lines BL0 and /BL0 on which write operation is performed decreases to the absolute value |Vtp| of the threshold voltage of the PMOS transistor MP2. Therefore, the memory cell power supply VDDM0 for memory cells which are not to be written and are connected to the bit lines BL0 and /BL0 on which write operation is performed (memory cells connected to inactive word lines other than the word line WLx) becomes lower than the retention voltage of the memory cell 10, leading to a problem that data store or hold in these memory cells 10 is destroyed.

In order to solve the above problem, a voltage which is higher than the memory cell power supply is applied to a substrate terminal of the PMOS transistor MP2 included in the memory cell power supply circuit 20. For example, the power supply VDD or a potential higher than the power supply VDD may be applied. The substrate bias effect of the PMOS transistor MP2 causes the absolute value of the threshold voltage to be greater than the absolute value |Vtp| of the threshold voltage of the load transistor, and therefore, the memory cell power supply does not become lower than the retention voltage of the memory cell 10. As a result, a semiconductor storage device in which data in the memory cells 10 is not destroyed can be provided.

Alternatively, in order to solve the above problem, the channel length of the PMOS transistor MP2 included in the memory cell power supply circuit 20 may be set to be greater than the channel lengths of the load transistor and the drive transistor included in the memory cell 10. The retention voltage is determined by the absolute value of the threshold voltage of the load transistor or the drive transistor. The threshold voltage of a transistor depends on the channel length of the transistor. The absolute value of the threshold voltage decreases with a decrease in the channel length. Therefore, if the channel length of the PMOS transistor MP2 included in the memory cell power supply circuit 20 is set to be greater than the channel length of the load transistor or the drive transistor included in the memory cell 10, the absolute value of the threshold voltage of the PMOS transistor MP2 included in the memory cell power supply circuit 20 becomes greater than |Vtp|. Therefore, the memory cell power supply does not become lower than the retention voltage of the memory cell 10. As a result, a semiconductor storage device in which data in the memory cells 10 is not destroyed can be provided.

Still alternatively, in order to solve the above problem, the concentration of impurity implanted in the diffusion region of the PMOS transistor MP2 included in the memory cell power supply circuit 20 may be set to be higher than the concentration of impurity implanted in the diffusion region of the load transistor included in the memory cell 10. The threshold voltage of a transistor depends on the concentration of impurity implanted in the diffusion region of the transistor. The absolute value of the threshold voltage increases with an increase in the impurity concentration. Therefore, if the concentration of impurity implanted in the diffusion region of the PMOS transistor MP2 included in the memory cell power supply circuit 20 is set to be higher than the concentration of impurity implanted in the diffusion region of the load transistor included in the memory cell 10, the absolute value of the threshold voltage of the PMOS transistor MP2 included in the memory cell power supply circuit 20 becomes greater than |Vtp|. Therefore, the memory cell power supply does not become lower than the retention voltage of the memory cell 10. As a result, a semiconductor storage device in which data in the memory cells 10 is not destroyed can be provided.

<Leakage Current Compensation Circuit>

The leakage current compensation circuit 25 will now be described. In the semiconductor storage device of FIG. 1, during write operation, the potential of the memory cell power supply VDDM0 for memory cells 10 connected to the same pair of bit lines (e.g., the bit lines BL0 and /BL0) to which the memory cell 10 to be written is connected decreases from the power supply VDD level to the absolute value |Vtp| of the threshold voltage of the PMOS transistor MP2. When the potential of the memory cell power supply VDDM0 becomes |Vtp|, the PMOS transistor MP2 included in the memory cell power supply circuit 20 is turned off. At this time, the PMOS transistor MP1 is also off, and therefore, the memory cell power supply VDDM0 is put into the high-impedance state, and therefore, there is not means for supplying charge to the memory cell power supply VDDM0.

A small leakage current flows through the memory cell 10. Also, a leakage current flows through the PMOS transistor MP2 itself included in the memory cell power supply circuit 20. Therefore, the potential of the memory cell power supply VDDM0 decreases with time from |Vtp|. Therefore, if a current corresponding to these leakage currents is supplied, the level of the memory cell power supply VDDM0 does not decrease. The leakage current compensation circuit 25 of FIG. 3 is an example circuit for supplying a current corresponding to the small leakage current.

In the memory cell 10, the pair of the load transistor L1 and the drive transistor D1 and the pair of the load transistor L2 and the drive transistor D2 form the respective inverters. An output terminal of each inverter is connected to an input terminal of the other inverter to form a flip-flop. For example, when the load transistor L1 is on and the drive transistor D1 is off, the load transistor L2 is off and the drive transistor D2 is on. Therefore, the leakage current flowing through the memory cell 10 is the sum of a leakage current flowing through the off-state load transistor L2 and a leakage current flowing through the off-state drive transistor D1.

The load transistor is a PMOS transistor and the drive transistor is an NMOS transistor. Therefore, for example, as in the configuration of FIG. 3, a configuration which mimics the off-state load transistor (PMOS transistor) and the off-state drive transistor (NMOS transistor) of the memory cell 10 is connected to the memory cell power supply. Moreover, by changing the channel width or channel length of a MOS transistor included in the leakage current compensation circuit 25 or the number of MOS transistors, the current corresponding to the leakage current flowing through the memory cell 10 can be supplied.

In this case, it is desirable that the concentration of impurity implanted in the diffusion region of the PMOS transistor MP6 included in the leakage current compensation circuit 25 be substantially equal to that of the load transistor of the memory cell 10, and it is also desirable that the concentration of impurity implanted in the diffusion region of the NMOS transistor MN1 be substantially equal to that of the drive transistor of the memory cell 10. If the concentration of impurity is substantially the same, the leakage current compensation circuit 25 can have good ability to follow a change in the leakage current which is caused by a change in temperature or power supply voltage.

Similarly, it is desirable that the channel length of the PMOS transistor MP6 included in the leakage current compensation circuit 25 be substantially equal to that of the load transistor of the memory cell 10, and it is also desirable that the channel length of the NMOS transistor MN1 be substantially equal to that of the drive transistor of the memory cell 10. If the transistor channel length is substantially the same, the leakage current compensation circuit 25 can have good ability to follow a change in the leakage current which is caused by a change in temperature or power supply voltage.

As described above, if a circuit for compensating for the leakage current is connected to the memory cell power supply, the memory cell power supply does not become lower than the retention voltage of the memory cell 10. As a result, a semiconductor storage device in which data in the memory cells 10 is not destroyed can be provided.

If the leakage current of the load transistor of the memory cell 10 is very dominating, the leakage current compensation circuit 25 may include only PMOS transistors. If the leakage current of the drive transistor of the memory cell 10 is very dominating, the leakage current compensation circuit 25 may include only NMOS transistors.

If the leakage current of the PMOS transistor MP2 included in the memory cell power supply circuit 20 is very dominating, the leakage current compensation circuit 25 may include PMOS transistors. In this case, if a diode-connected PMOS transistor (the gate and drain are connected together) is provided between the power supply VDD and the memory cell power supply (the memory cell power supply is connected to the gate terminal), the leakage current compensation circuit 25 can have good ability to follow a change in the leakage current which is caused by a change in temperature or power supply voltage. In this case, in addition, if the transistor has the same transistor width and transistor length as those of the PMOS transistor MP2, the leakage current compensation circuit 25 can have better ability to follow a change in the leakage current which is caused by a change in temperature or power supply voltage.

The MOS transistors included in the leakage current compensation circuit 25 of FIG. 3 are one PMOS transistor and one NMOS transistor as an example. Alternatively, the leakage current compensation circuit 25 of FIG. 3 may include a plurality of PMOS transistors and a plurality of NMOS transistors which are connected together in parallel or in series.

The leakage current compensation circuit 25 of FIG. 3 includes off-state MOS transistors as an example. Alternatively, the leakage current compensation circuit 25 of FIG. 3 may include on-state MOS transistors. Specifically, the ground power supply or the memory cell power supply may be connected to the gate terminal of the PMOS transistor MP6, or the power supply VDD or the memory cell power supply may be connected to a gate terminal of the NMOS transistor MN1.

That is to say, the leakage current compensation circuit 25 is only required to supply a current corresponding to the leakage current of the memory cell 10 to the memory cell power supply. Therefore, the current supplied to the memory cell power supply may be adjusted by adjusting the channel length or channel width of a MOS transistor connected between the VDD power supply and the memory cell power supply or by increasing or decreasing the number of MOS transistors connected between the VDD power supply and the memory cell power supply. Thereafter, the MOS transistors included in the leakage current compensation circuit 25 may be configured so that the current corresponding to the leakage current of the memory cell 10 is eventually supplied to the memory cell power supply.

In a typical semiconductor storage device, the bit line precharge circuit 15 for precharging the bit lines to the high level (the power supply VDD level) is provided adjacent to a memory cell array region including a plurality of memory cells 10. The bit line precharge circuit 15 needs to perform an operation of precharging the bit lines to the high level (the power supply VDD level), and therefore, includes the PMOS transistors MP3-MP5 provided between the power supply VDD and the bit lines. Therefore, if the PMOS transistors included in the leakage current compensation circuit 25 are provided in the same substrate region (N-well region) in which the bit line precharge circuit 15 is provided, the area of the semiconductor storage device can be reduced compared to when the PMOS transistors MP3-MP5 included in the bit line precharge circuit 15 and the PMOS transistor MP6 included in the leakage current compensation circuit 25 are provided in separate substrate regions.

<Power Supply Voltage Detection Circuit>

The power supply voltage detection circuit 30 is a circuit for determining a state of a power supply voltage which is applied to a semiconductor storage device or a semiconductor integrated circuit including a semiconductor storage device. For example, the power supply voltage detection circuit 30 is configured to output a low-level signal if the power supply voltage which is applied to a semiconductor storage device or a semiconductor integrated circuit including a semiconductor storage device is higher than one volt, and a high-level signal if the power supply voltage is lower than one volt.

When the power supply voltage detection circuit 30 outputs a low-level signal, the NAND circuit NAND1 outputs a high-level signal irrespective of the states of the column address signals AD0 and AD1 and the write control signal WEN, and the inverter circuit INV1 outputs a low-level signal. As a result, the PMOS transistors MP1 and MP2 included in the memory cell power supply circuit 20 are turned on and off, respectively, and therefore, the memory cell power supply VDDM0 and VDDM1 invariably output a power supply VDD-level signal.

The write characteristics of the memory cell 10 deteriorate with a decrease in the power supply voltage of the semiconductor storage device. Therefore, during write operation, the operation of improving the write characteristics of the memory cell 10 by reducing the memory cell power supply may be performed only when the power supply voltage for the semiconductor storage device is low (e.g., the power supply voltage applied to the semiconductor storage device is lower than one volt).

When the power supply voltage for the semiconductor storage device is high (e.g., the power supply voltage applied to the semiconductor storage device is higher than one volt), then even if, during write operation, the write characteristics of the memory cell 10 are improved by decreasing the memory cell power supply, a problem does not arise, but the memory cell power supply varies during write operation, and therefore, an unwanted charge or discharge current flows through the memory cell power supply.

Therefore, if, as in this embodiment, the power supply voltage detection circuit 30 is provided to control and fix the memory cell power supply included in the memory cell power supply circuit 20 to the power supply VDD level (the PMOS transistor MP2 included in the memory cell power supply circuit 20 is caused to be invariably off) when the power supply voltage of the semiconductor storage device is higher than a particular voltage, the power consumption of the semiconductor storage device can be reduced.

In this illustrative embodiment, the PMOS transistor MP2 included in the memory cell power supply circuit 20 is configured to be invariably off based on a signal which is based on the output signal of the power supply voltage detection circuit 30. Alternatively, the NAND circuit NAND1 of FIG. 1 may be replaced with a two-input NAND circuit, an NMOS transistor may be provided between the PMOS transistor MP2 included in the memory cell power supply circuit 20 and the ground power supply, and a gate terminal of the NMOS transistor may be controlled based on a signal which is based on the output signal of the power supply voltage detection circuit 30. In this case, substantially the same operation and effects as those of this embodiment are obtained.

Note that the power supply voltage detection circuit 30 may not be provided in each semiconductor storage device as shown in FIG. 1. If a plurality of semiconductor storage devices are provided in a semiconductor integrated circuit, a single power supply voltage detection circuit 30 may be provided in the semiconductor integrated circuit, and the output signal thereof may be connected to each of the semiconductor storage devices. If all the semiconductor storage devices are controlled using the single power supply voltage detection circuit 30, the area of the semiconductor integrated circuit can be reduced.

<First Timing Chart>

Figure 4:
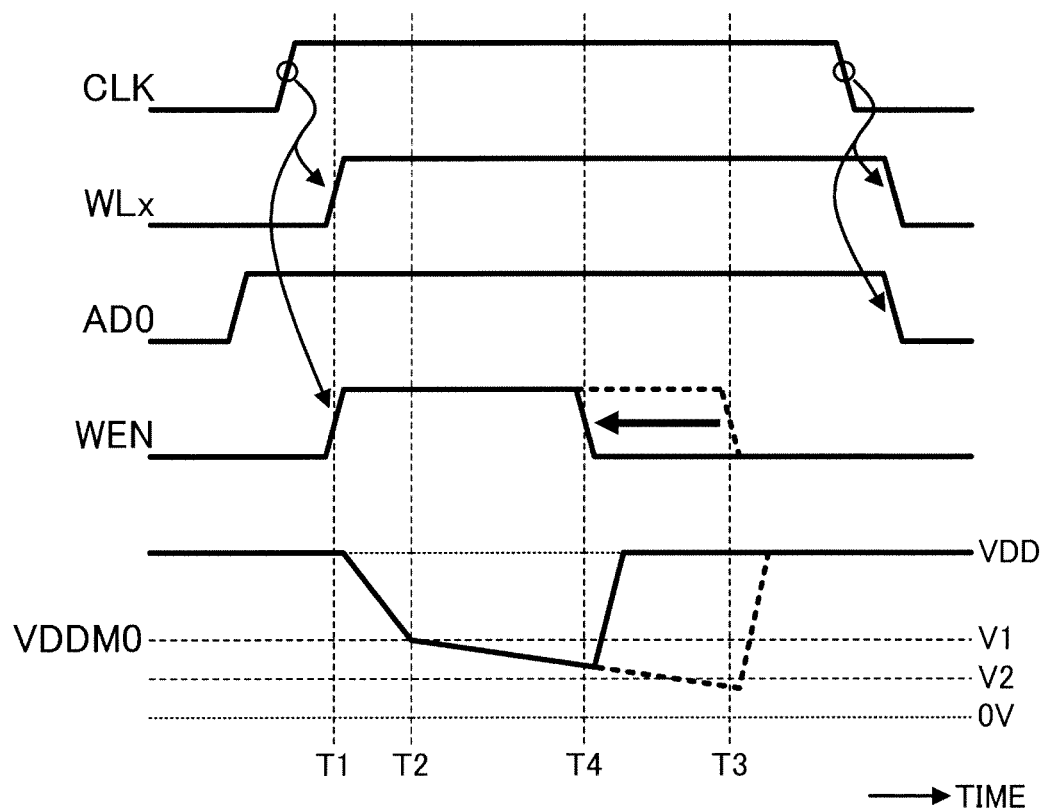
FIG. 4 is a timing chart for describing operation of the semiconductor storage device of FIG. 1.

FIG. 4 is a timing chart for describing operation of the semiconductor storage device of FIG. 1. In FIG. 4, a reference character CLK indicates a clock signal which is input to the semiconductor storage device, a reference character WLx indicates a word line, a reference character AD0 indicates a column address signal, a reference character WEN indicates a write control signal, and a reference character VDDM0 indicates a memory cell power supply. These signal names correspond to the respective signal names shown in FIG. 1.

The timing chart of FIG. 4 shows write operation which is performed on the memory cell 10 which is connected to the word line WLx and the bit lines BL0 and /BL0 (the upper left memory cell in FIG. 1).

The semiconductor storage device is controlled so that one of the word lines W0-WLx is activated in synchronization with the clock signal CLK. Therefore, the word line WLx is active (high) during substantially the same period of time during which the clock signal CLK is high.

When the clock signal CLK goes from low to high, the word line WLx goes high (active) at time T1, and at the same time, the write control signal WEN also goes high (active).

The column address signal AD0 is configured so that the potential thereof does not change during the period of time during which the clock signal CLK is high. In this case, the column address signal AD0 is high (selected) during the period of time during which the clock signal CLK is high. Although not shown in FIG. 4, the column address signal AD1 is low (not selected).

When the column address signal AD0 is high (selected), then if the write control signal WEN goes high (active), the memory cell power supply VDDM0 changes from the voltage VDD (time T1) to a voltage V1 (time T2). The voltage V1 is a potential which is slightly higher than the absolute value |Vtp| of the threshold voltage of the PMOS transistor MP2 of FIG. 1. In the configuration of FIG. 1, the potential of the memory cell power supply VDDM0 decreases with time from the voltage V1 due to a small leakage current flowing through the memory cell 10.

When the timing of the write control signal WEN is set so that the write control signal WEN changes from high (active) to low (inactive) at time T3, the potential of the memory cell power supply VDDM0 is lower than a voltage V2 at time T3. Here, the voltage V2 is the retention voltage of the memory cell 10. Therefore, when the write control signal WEN is active from time T1 to time T3, the potential of the memory cell power supply VDDM0 is lower than the retention voltage V2 of the memory cell 10. As a result, data in the memory cell 10 is destroyed.

Therefore, as shown in FIG. 4, the timing of the write control signal WEN is set so that the write control signal WEN is active from time T1 to time T4. In this case, the potential of the memory cell power supply VDDM0 does not become lower than or equal to the retention voltage V2. Therefore, a semiconductor storage device in which data in the memory cell 10 is not destroyed can be provided.

As described above, the timing of the write control signal WEN may be set so that the period of time during which the write control signal WEN is active has an upper limit, whereby the potential of the memory cell power supply does not become lower than or equal to the retention voltage of the memory cell 10 due to the leakage current of the memory cell 10.

Figure 5:
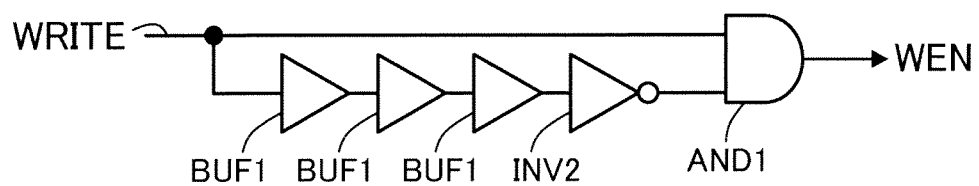
FIG. 5 is a circuit diagram showing an example technique of generating a write control signal in the semiconductor storage device of FIG. 1.

FIG. 5 is a circuit diagram showing an example technique of generating the write control signal WEN. The circuit of FIG. 5 includes buffer circuits BUF1, an inverter circuit INV2, and an AND circuit AND1. A reference character WRITE indicates a write determination signal.

The write determination signal WRITE is synchronous with the clock signal CLK input to the semiconductor storage device, and during write operation, is active (high) during the same period of time during which the clock signal CLK is high. The buffer circuit BUF1 includes an even number of stages of inverter circuits, and delays a signal input thereto by a predetermined time before outputting the signal.

The write control signal WEN is generated by logical AND of the write determination signal WRITE and an inverted version of the signal obtained by delaying the write determination signal WRITE by the predetermined time. Therefore, the write control signal WEN goes high (active) when the write determination signal WRITE goes high, and goes low (inactive) after a delay time which is determined based on the buffer circuits BUF1 and the inverter circuit INV2. Therefore, the write control signal WEN generated by the circuit configuration of FIG. 5 is substantially the same as that shown in the timing chart of FIG. 4.

In the circuit configuration of FIG. 5, for example, if the number of the buffer circuits BUF1 connected together is increased or decreased, the period of time during the write control signal WEN is active can be easily changed.

As described above, if the write control signal WEN is generated using the circuit configuration of FIG. 5, the period of time during which the write control signal WEN is active can be easily adjusted. Therefore, the circuit configuration of FIG. 5 may be used as means for setting the timing of the period of time during the write control signal WEN is active so that the period of time during the write control signal WEN is active has an upper limit, whereby the potential of the memory cell power supply does not become lower than or equal to the retention voltage of the memory cell 10 due to the leakage current of the memory cell 10.

<Second Timing Chart>

Figure 6:
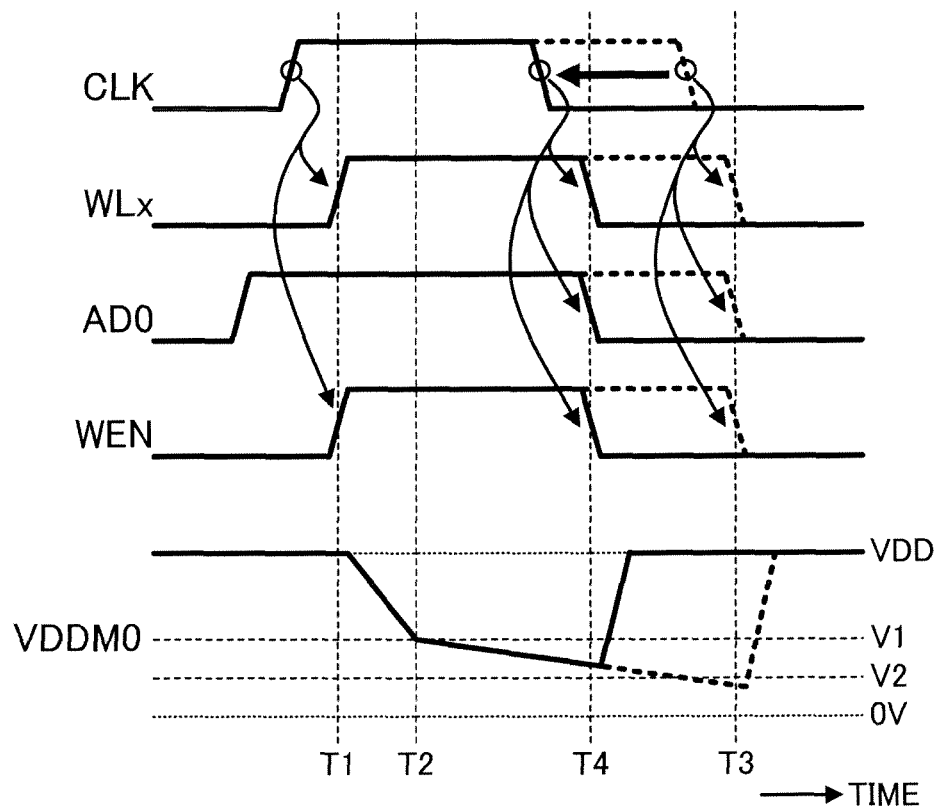
FIG. 6 is a timing chart for describing another operation of the semiconductor storage device of FIG. 1.

FIG. 6 is a timing chart for describing another operation of the semiconductor storage device of FIG. 1. The timing chart of FIG. 6 also shows write operation which is performed on the memory cell 10 which is connected to the word line WLx and the bit lines BL0 and /BL0 (the upper left memory cell in FIG. 1).

The semiconductor storage device is controlled so that one of the word lines W0-WLx is activated in synchronization with the clock signal CLK, and moreover, the write control signal WEN is also controlled so that the write control signal WEN becomes active in synchronization with the clock signal CLK during write operation. Therefore, the word line WLx is active (high level) during substantially the same period of time during which the clock signal CLK is high. Similarly, during write operation, the write control signal WEN is also active (high) during substantially the same period of time during which the clock signal CLK is high.

When the clock signal CLK goes from low to high, the word line WLx goes high (active) at time T1, and at the same time, the write control signal WEN also goes high (active). The column address signal AD0 is configured so that the potential thereof does not change during the period of time during which the clock signal CLK is high. In this case, the column address signal AD0 is high (selected) during the period of time during which the clock signal CLK is high. Although not shown in FIG. 6, the column address signal AD1 is low (not selected).

When the column address signal AD0 is high (selected), then if the write control signal WEN goes high (active), the memory cell power supply VDDM0 changes from the voltage VDD (time T1) to a voltage V1 (time T2). The voltage V1 is a potential which is slightly higher than the absolute value |Vtp| of the threshold voltage of the PMOS transistor MP2 of FIG. 1. In the configuration of FIG. 1, the potential of the memory cell power supply VDDM0 decreases with time from the voltage V1 due to a small leakage current flowing through the memory cell 10.

When the clock signal CLK goes from high to low, the word line WLx changes from high (active) to low (inactive) at time T3, and at the same time, the write control signal WEN changes from high (active) to low (inactive). At this time, the potential of the memory cell power supply VDDM0 is lower than a voltage V2 at time T3. Here, the voltage V2 is the retention voltage of the memory cell 10. Therefore, when the write control signal WEN is active from time T1 to time T3, the potential of the memory cell power supply VDDM0 is lower than the retention voltage V2 of the memory cell 10. As a result, data in the memory cell 10 is destroyed.

Therefore, as shown in FIG. 6, the timing of the write control signal WEN is set so that the write control signal WEN is active from time T1 to time T4. In the semiconductor storage device of this embodiment, the period of time during which the write control signal WEN is active is set to be synchronous with the clock signal CLK, and therefore, by reducing the period of time during which the clock signal CLK is high, the period of time during which the write control signal WEN is active can be changed.

If the period of time during which the clock signal CLK is high is set so that the write control signal WEN is active from time T1 to time T4, the potential of the memory cell power supply VDDM0 does not become lower than or equal to the retention voltage V2. Therefore, a semiconductor storage device in which data in the memory cell 10 is not destroyed can be provided.

As described above, the timing of the write control signal WEN needs to be set to be synchronous with the clock signal CLK so that the period of time during which the clock signal CLK input to the semiconductor storage device is high has an upper limit, whereby the potential of the memory cell power supply does not become lower than or equal to the retention voltage of the memory cell 10 due to the leakage current of the memory cell 10.

In this illustrative embodiment, the word line is activated when the clock signal CLK input to the semiconductor storage device is high. Alternatively, in a semiconductor storage device in which the word line is activated when the clock signal CLK input to the semiconductor storage device is low, the period of time during which the clock signal CLK input to the semiconductor storage device is low may have an upper limit.

<Third Timing Chart>

Figure 7:
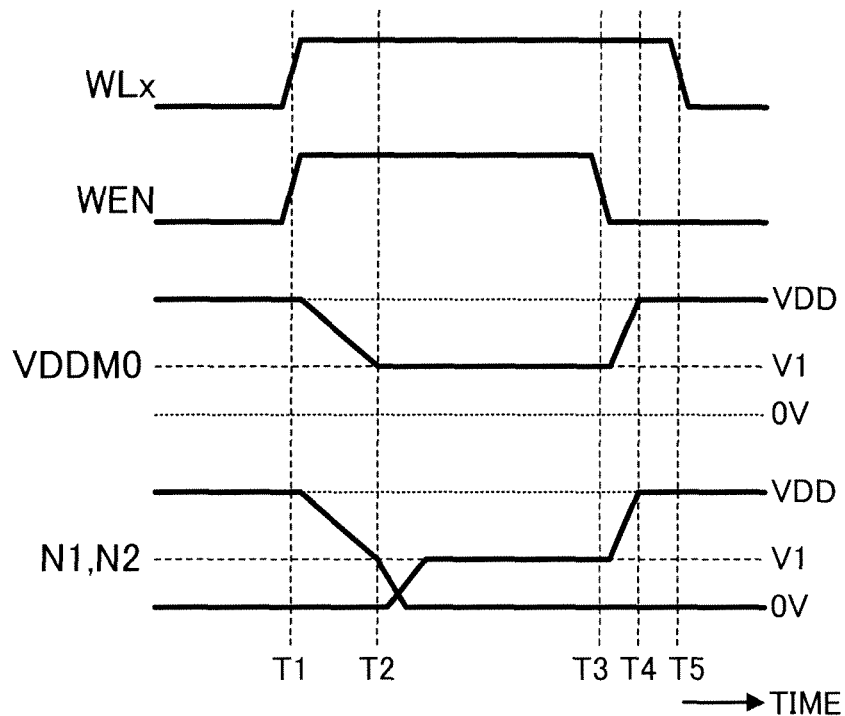
FIG. 7 is a timing chart for describing still another operation of the semiconductor storage device of FIG. 1.

FIG. 7 is a timing chart for describing still another operation of the semiconductor storage device of FIG. 1. In FIG. 7, memory cell storage nodes N1 and N2 specifically indicate the states of the source terminals of the access transistors A1 and A2, respectively, included in the memory cell 10.

The timing chart of FIG. 7 also shows write operation which is performed on the memory cell 10 which is connected to the word line WLx and the bit lines BL0 and /BL0 (the upper left memory cell in FIG. 1).

In the semiconductor storage device, the word line WLx goes high (active) at time T1, and at the same time, the write control signal WEN also goes high (active). Although not shown in FIG. 7, the column address signal AD0 is high (selected), and the column address signal AD1 is low (not selected).

When the column address signal AD0 is high (selected), then if the write control signal WEN goes high (active), the memory cell power supply VDDM0 changes from the voltage VDD (time T1) to a voltage V1 (time T2). The voltage V1 is a potential which is slightly higher than the absolute value |Vtp| of the threshold voltage of the PMOS transistor MP2 of FIG. 1.

It is assumed that prior to write operation, the high level is stored or held at the source terminal of the access transistor A1 of the memory cell 10 to be written, and the low level is stored or held at the source terminal of the access transistor A2 of the memory cell 10 to be written. It is also assumed that during write operation, the bit line BL0 changes from high to low.

The memory cell 10 is rewritten in the vicinity of time T2. In this case, the bit line BL0 is low, and therefore, the potential of the source terminal of the access transistor A1 of the memory cell 10 to be written changes from high to low. The source terminal of the access transistor A1 is the input of the inverter including the load transistor L2 and the drive transistor D2. Therefore, when the potential of the source terminal of the access transistor A1 exceeds the switching voltage of the inverter, data in the memory cell 10 is inverted, i.e., the data rewrite operation is completed. At this time, the source terminal of the access transistor A1 of the memory cell 10 to be written is at 0 V, and the source terminal of the access transistor A2 of the memory cell 10 to be written is at the voltage V1.

Although, actually, the memory cell power supply VDDM0 decreases from the voltage V1 due to a small leakage current of the memory cell 10, it is assumed that a leakage current does not flow through the memory cell 10 for the sake of simplicity.

At time T3, the write control signal WEN goes low (inactive), and the potential of the memory cell power supply VDDM0 returns from the voltage V1 to the power supply VDD level (time T4). Along with this, the potential of the source terminal of the access transistor A2, i.e., the memory cell storage node N2, also returns from the voltage V1 to the power supply VDD level (time T4). Thereafter, at time T5, the word line WLx goes low (inactive), i.e., the write operation is completed.

As described above, if the semiconductor storage device of FIG. 1 is operated at timings of the word line WLx and the write control signal WEN as shown in FIG. 7, normal write operation can be performed.

In contrast to this, if the word line WLx is configured to change from active to inactive before the write control signal WEN changes from active to inactive, the memory cell power supply VDDM0 is the voltage V1 when the word line WLx goes low (inactive). Because the voltage V1 is a potential in the vicinity of |Vtp|, the power supply (a potential difference between the source terminal of the load transistor and the source terminal of the drive transistor) of the flip-flop (two inverters) included in the memory cell 10 is extremely low, and therefore, the noise resistance (noise margin) of the flip-flop (memory cell) deteriorates. Therefore, data stored in the flip-flop (memory cell) is easily inverted due to coupling noise occurring when the word line WLx changes from high to low (specifically, noise occurring in a capacitance between the gate and source terminals of the access transistor, noise occurring in an interconnect capacitance between the word line and the memory cell storage nodes N1 and N2, etc.).

However, in the timing chart of FIG. 7, the semiconductor storage device in which, during write operation, the memory cell power supply is controlled to a potential which is lower than the power supply VDD, whereby the write characteristics of the memory cell 10 are improved, is configured so that the write control signal WEN changes from active to inactive before the word line WLx changes from active to inactive. In other words, the memory cell power supply goes to the power supply VDD level before the word line WLx changes from active to inactive. As a result, in the semiconductor storage device in which the memory cell power supply is decreased during write operation, normal write operation can be performed.

Figure 8:
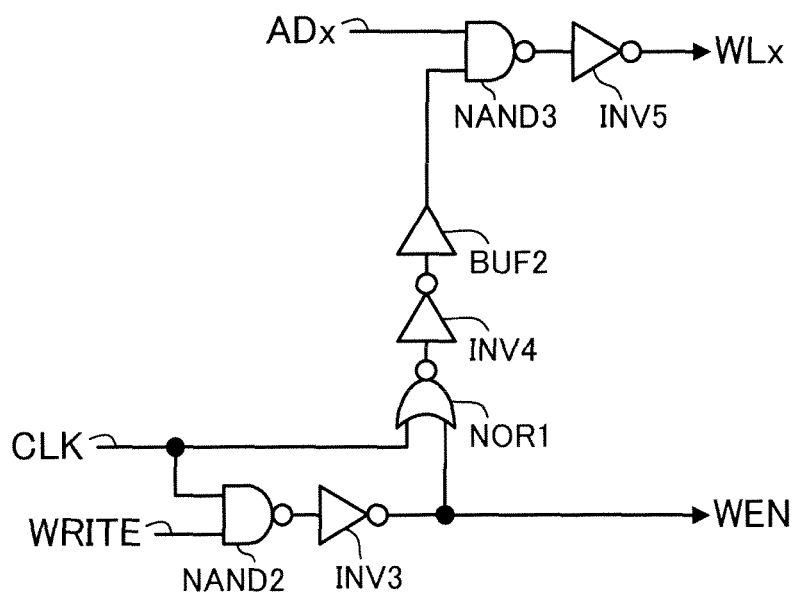
FIG. 8 is a circuit diagram showing an example specific configuration of a control circuit which generates a word line control signal and controls a memory cell power supply, in the semiconductor storage device of FIG. 1.

FIG. 8 is a circuit diagram showing an example specific configuration of a control circuit which generates a word line control signal and controls the memory cell power supply, in the semiconductor storage device of this embodiment. The control circuit of FIG. 8 includes inverter circuits INV3-INV5, NAND circuits NAND2 and NAND3, a NOR circuit NOR1, and a buffer circuit BUF2. A reference character ADx indicates a row address signal. A reference character WLx indicates a word line. A reference character CLK indicates a clock signal which is input to the semiconductor storage device. A reference character WRITE indicates a write determination signal. A reference character WEN indicates a write control signal.

The clock signal CLK is input to each of the NOR circuit NOR1 and the NAND circuit NAND2. The NAND circuit NAND2 receives the clock signal CLK and the write determination signal WRITE. The output of the NAND circuit NAND2 is input to the inverter circuit INV3. The output of the inverter circuit INV3 is the write control signal WEN.

On the other hand, the clock signal CLK and the write control signal WEN are input to the NOR circuit NOR1. The output of the NOR circuit NOR1 is input to the inverter circuit INV4. The output of the inverter circuit INV4 is input to the buffer circuit BUF2. The output signal of the buffer circuit BUF2 and the row address signal ADx are input to the NAND circuit NAND3. The output of the NAND circuit NAND3 is input to the inverter circuit INV5. The output of the inverter circuit INV5 is output as the word line WLx.

Here, the write determination signal WRITE is synchronous with the clock signal CLK input to the semiconductor storage device, and during write operation, is active (high) during the same period of time during which the clock signal CLK is high. The row address signal ADx is configured so that the potential thereof does not change during the period of time during which the clock signal CLK is high. In this case, the row address signal ADx is high (selected) during the period of time during which the clock signal CLK is high. The buffer circuit BUF2 includes an even number of stages of inverter circuits, and delays a signal input thereto by a predetermined time before outputting the signal.

Initially, when the clock signal CLK is low, the NAND circuit NAND2 outputs a high-level signal irrespective of the state of the write determination signal WRITE. Therefore, the write control signal WEN which is the output of the inverter circuit INV3 goes low (inactive). Because the clock signal CLK is low and the write control signal WEN is also low, the output of the NOR circuit NOR1 is high, the output of the inverter circuit INV4 is low, and the output of the buffer circuit BUF2 is also low. Therefore, the NAND circuit NAND3 outputs a high-level signal irrespective of the state of the row address signal ADx. Therefore, the word line WLx which is the output of the inverter circuit INV5 goes low (inactive). Referring back to FIG. 1, because the write control signal WEN is low, the NAND circuit NAND1 outputs a high-level signal irrespective of the state of the column address signal AD0, and the inverter circuit INV1 outputs a low-level signal. As a result, the PMOS transistors MP1 and MP2 included in the memory cell power supply circuit 20 are turned on and off, respectively, and the memory cell power supply VDDM0 outputs a power supply VDD-level signal.

Next, when the clock signal CLK goes high, the NOR circuit NOR1 outputs a low-level signal irrespective of the input of the write control signal WEN. Therefore, the output of the inverter circuit INV4 goes high, and the output of the buffer circuit BUF2 goes high. Because the row address signal ADx is high, the output of the NAND circuit NAND3 goes low. As a result, the word line WLx which is the output of the inverter circuit INV5 goes high (active). During write operation, when the clock signal CLK goes high, the output of the NAND circuit NAND2 goes low because the write determination signal WRITE is high. As a result, the write control signal WEN which is the output of the inverter circuit INV3 goes high (active). Referring back to FIG. 1, because the column address signal AD0 is high, the output of the NAND circuit NAND1 goes low, and the output of the inverter circuit INV1 goes high. Therefore, the PMOS transistors MP1 and MP2 included in the memory cell power supply circuit 20 are turned off and on, respectively, and the memory cell power supply VDDM0 decreases from the power supply VDD level. After a lapse of a predetermined time, the potential of the memory cell power supply VDDM0 changes to the absolute value |Vtp| of the threshold voltage of the PMOS transistor MP2 included in the memory cell power supply circuit 20.

Next, when the clock signal CLK changes from high to low, the NAND circuit NAND2 changes to the high level irrespective of the state of the write determination signal WRITE. As a result, the write control signal WEN which is the output of the inverter circuit INV3 changes to the low level (inactive state). Because the clock signal CLK is low and the write control signal WEN is also low, the output of the NOR circuit NOR1 changes to the high level, the output of the inverter circuit INV4 changes to the low level, and the output of the buffer circuit BUF2 changes to the low level. As a result, the NAND circuit NAND3 outputs a high-level signal irrespective of the state of the row address signal ADx, and the word line WLx which is the output of the inverter circuit INV5 changes to the low level (inactive state). Referring back to FIG. 1, because the write control signal WEN changes to the low level, the NAND circuit NAND1 changes to the high level irrespective of the state of the column address signal AD0, and the output of the inverter circuit INV1 changes to the low level. As a result, the PMOS transistors MP1 and MP2 of the memory cell power supply circuit 20 are turned on and off, respectively, and the memory cell power supply VDDM0 returns from the |Vtp| level to the power supply VDD level.

The operation of the example specific configuration of the word line and the control circuit for generating the memory cell power supply has been described above.

As described above with reference to FIG. 7, the memory cell power supply which is controlled based on the write control signal may be returned to the power supply VDD level before the word line changes from active to inactive in order to achieve normal write operation in a semiconductor storage device in which, during write operation, the memory cell power supply is decreased.

In the configurations of FIGS. 1 and 8, when the clock signal CLK goes from high to low, the word line changes from high (active) to low (inactive), and at the same time, the memory cell power supply returns from the |Vtp| level to the power supply VDD level.

Logic gates have almost equal delay times (a time which it takes for a signal to pass through one logic gate). Therefore, in the configurations of FIGS. 1 and 8, in order to cause the memory cell power supply which is controlled based on the write control signal to return to the power supply VDD level before the word line changes from active to inactive, the number of logic stages required to change the memory cell power supply VDDM0 to the power supply VDD level (the clock signal CLK is input to the first stage) may be set to be smaller than the number of logic stages required to control the word line WLx to the low level (inactive state).

In the case of FIGS. 1 and 8, the number of logic stages required to change the memory cell power supply VDDM0 to the power supply VDD level is five. The specific path from the clock signal CLK includes the NAND circuit NAND2, the inverter circuit INV3, the NAND circuit NAND1, the inverter circuit INV1, and the PMOS transistor MP1.

In contrast to this, the number of logic stages required to control the word line WLx to the low level (inactive state) is eight. The specific path from the clock signal CLK includes the NAND circuit NAND2, the inverter circuit INV3, the NOR circuit NOR1, the inverter circuit INV4, the buffer circuit BUF2, the NAND circuit NAND3, and the inverter circuit INV5. The buffer circuit BUF2 is considered as two inverter circuits.

With the above-described configuration, in a semiconductor storage device in which, during write operation, the memory cell power supply is controlled to a potential lower than the power supply VDD to improve the write characteristics of the memory cell 10, the memory cell power supply can be configured to go to the power supply VDD level before a word line changes from active to inactive, and therefore, normal write operation can be performed.

Although, in this illustrative embodiment, the memory cell 10 is assumed to have a single port, the memory cell 10 may have a plurality of ports, and in this case, substantially the same operation and effects are obtained.

In a typical semiconductor storage device, the bit line precharge circuit 15 for precharging bit lines to the high level (the power supply VDD level) is provided adjacent to a memory cell array region including a plurality of memory cells 10. The bit line precharge circuit 15 needs to precharge bit lines to the high level (the power supply VDD level), and therefore, includes the PMOS transistors MP3-MP5 between the power supply VDD and the bit lines. The PMOS transistors MP1 and MP2 included in the memory cell power supply circuit 20 are also PMOS transistors. Therefore, if the PMOS transistors MP1 and MP2 included in the memory cell power supply circuit 20 are both provided in the same substrate region (N-well region) in which the bit line precharge circuit 15 is provided, the area of the semiconductor storage device can be reduced compared to when the PMOS transistors MP3-MP5 included in the bit line precharge circuit 15 and the PMOS transistors MP1 and MP2 included in the memory cell power supply circuit 20 are provided in separate substrate regions.

Second Embodiment

Figure 9:
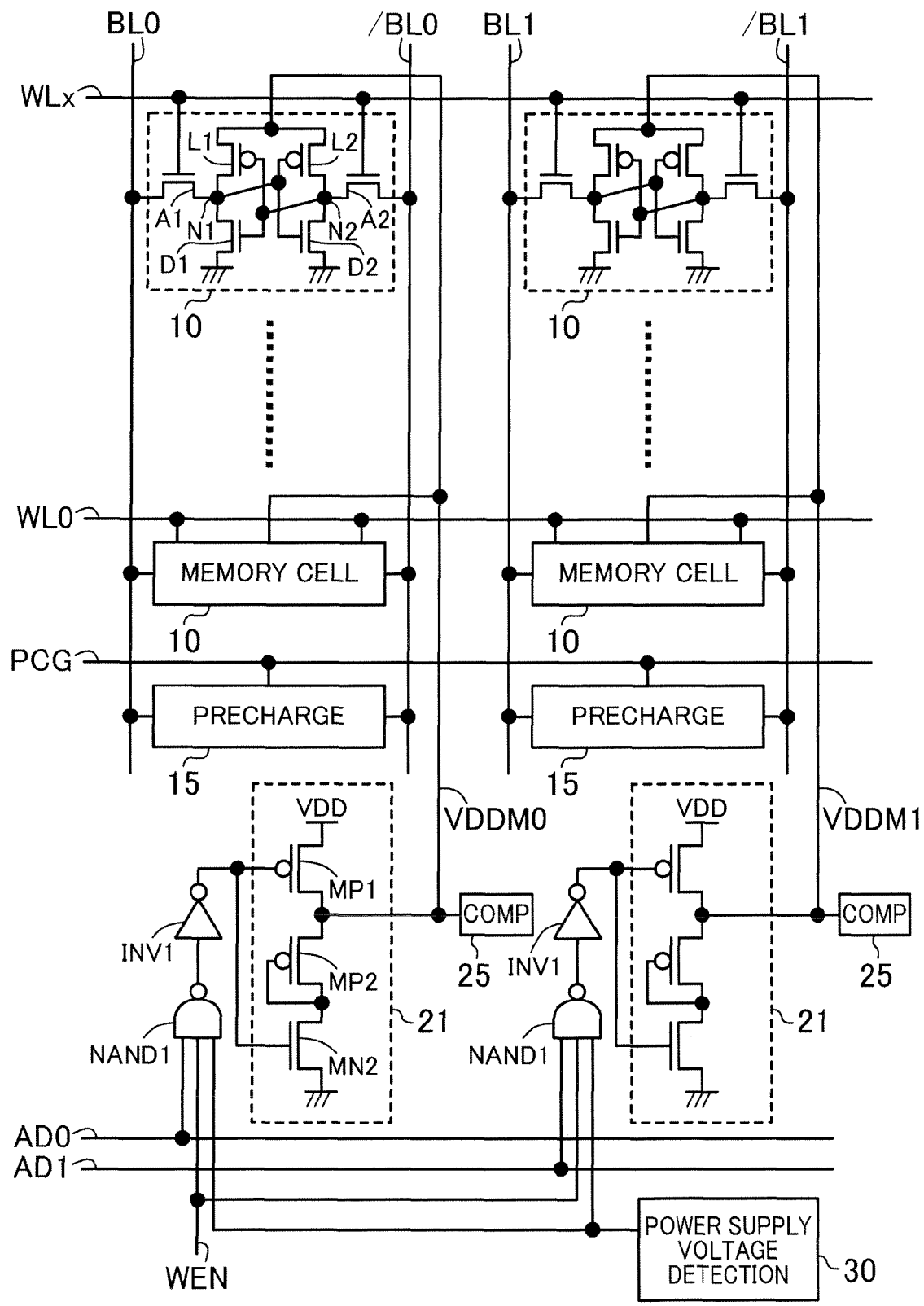
FIG. 9 is a diagram of a configuration of a semiconductor storage device according to a second embodiment of the present disclosure.

FIG. 9 is a diagram of a configuration of a semiconductor storage device according to a second embodiment of the present disclosure. The semiconductor storage device of FIG. 9 has the same configuration as that of FIG. 1 of the first embodiment, except for the configuration of MOS transistors included in a memory cell power supply circuit 21. Specifically, an NMOS transistor MN2 is added between the PMOS transistor MP2 and the ground power supply. Moreover, the gate terminal of the PMOS transistor MP2 is connected to a drain terminal of the NMOS transistor MN2, and the same signal that is input to the gate terminal of the PMOS transistor MP1 is input to a gate terminal of the NMOS transistor MN2.

The write control signal WEN is low (inactive), except for during write operation. Therefore, irrespective of the states of the column address signals AD0 and AD1, the NAND circuit NAND1 outputs a high-level signal, and the inverter circuit INV1 which receives the output of the NAND circuit NAND1 outputs a low-level signal. As a result, the PMOS transistor MP1 and the NMOS transistor MN2 included in the memory cell power supply circuit 21 are turned on and off, respectively, and therefore, all the memory cell power supplies VDDM0 and VDDM1 output a power supply VDD-level signal.

During write operation, when a word line becomes active, the write control signal WEN goes high (active). At this time, either of the column address signals AD0 and AD1 is high. For example, when data is written to the memory cell 10 connected to the word line WLx and the bit lines BL0 and /BL0 (the upper left memory cell of FIG. 9), the column address signal AD0 is high and the column address signal AD1 is low.

Therefore, the NAND circuit NAND1 which receives the column address signal AD0 outputs a low-level signal, and the inverter circuit INV1 in the following stage outputs a high-level signal. The PMOS transistor MP1 and the NMOS transistor MN2 of the memory cell power supply circuit 21 are turned off and on, respectively, and therefore, the potential of the memory cell power supply VDDM0 decreases from the power supply VDD level to the absolute value |Vtp| of the threshold voltage of the PMOS transistor MP2. When the potential of the memory cell power supply VDDM0 becomes |Vtp|, the PMOS transistor MP2 is turned off. Because the PMOS transistor MP1 and the PMOS transistor MP2 are both turned off, a current does not flow through the memory cell power supply circuit 21.

In contrast to this, the memory cell power supply VDDM1 for memory cells 10 connected to the bit lines BL1 and /BL1 on which write operation is not performed outputs a power supply VDD-level signal because the column address signal AD1 is low. It is not necessary to decrease, from the power supply VDD level, the memory cell power supply for memory cells 10 connected to bit lines on which write operation is not performed. A problem does not arise even when the memory cell power supply for memory cells 10 connected to bit lines on which write operation is not performed is decreased from the power supply VDD level. In this case, however, an unwanted charge or discharge current occurs in the memory cell power supply. Therefore, as in the above configuration, the memory cell power supply should be controlled and fixed to the power supply VDD level based on a signal which is based on the column address signal.

As described above, the semiconductor storage device of this embodiment of FIG. 9 performs substantially the same operation as that of the first embodiment of FIG. 1, and therefore, has substantially the same effects as that of the first embodiment. In addition, the memory cell power supply circuit 21 of this embodiment can be controlled using a single signal (the logical AND of the column address signal and the write control signal). Therefore, the number of signal interconnects can be reduced in the layout of the semiconductor storage device, and therefore, the flexibility of layout design is improved, resulting in a reduction in the area of the semiconductor storage device.

Note that, in this embodiment, the drain terminal of the NMOS transistor MN2 is connected to the gate terminal of the PMOS transistor MP2 included in the memory cell power supply circuit 21. Alternatively, the ground power supply may be connected to the gate terminal of the PMOS transistor MP2. In this case, substantially the same operation and effects are obtained.

Third Embodiment

Figure 10:
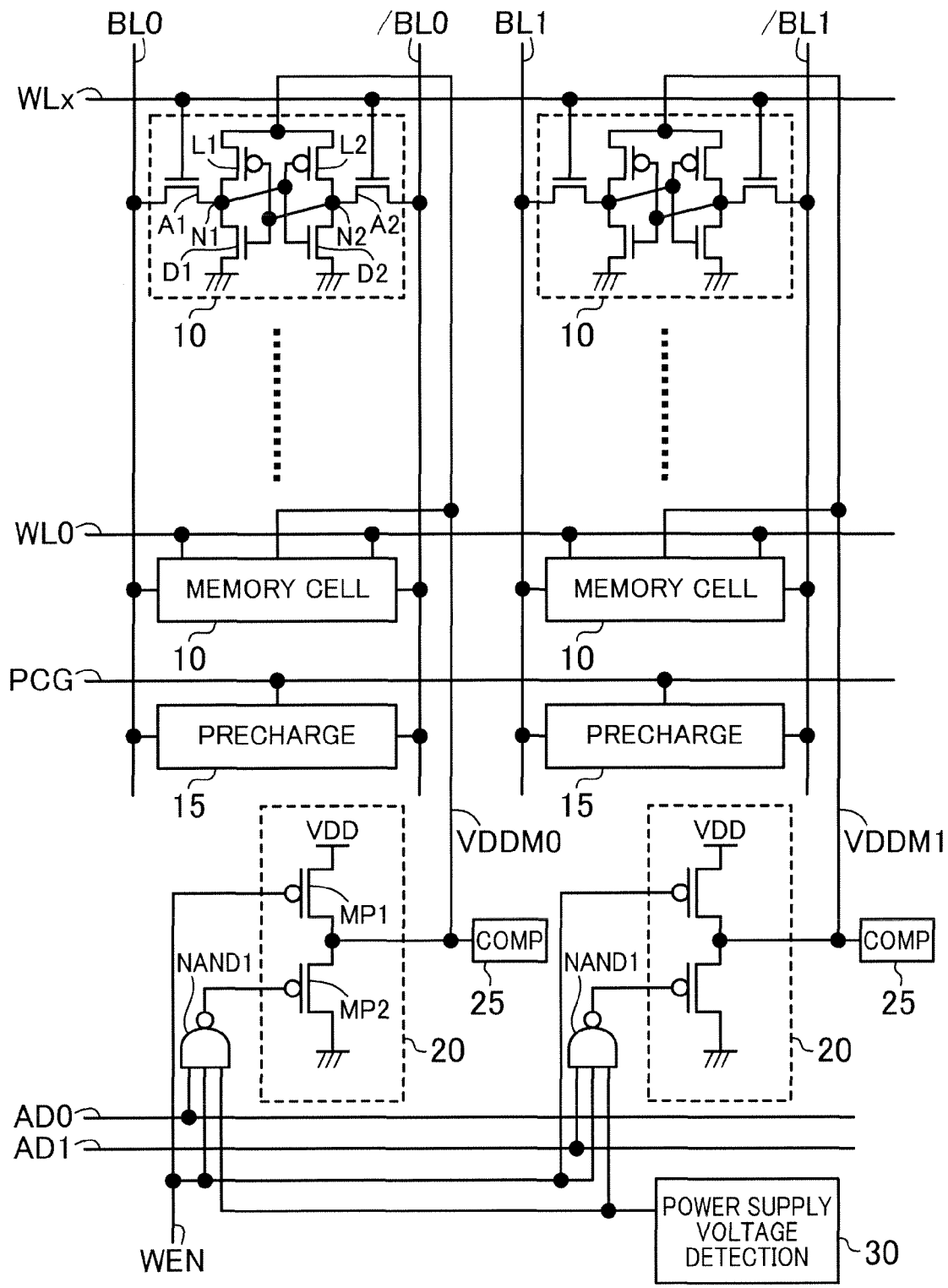
FIG. 10 is a diagram of a configuration of a semiconductor storage device according to a third embodiment of the present disclosure.

FIG. 10 is a diagram of a configuration of a semiconductor storage device according to a third embodiment of the present disclosure. The semiconductor storage device of FIG. 10 has the same configuration as that of the first embodiment of FIG. 1, except for the way in which the memory cell power supply circuit 20 is controlled. Specifically, the write control signal WEN is connected to the gate terminals of the PMOS transistors MP1 of all the memory cell power supply circuits 20.

The write control signal WEN is low (inactive), except for during write operation. Therefore, irrespective of the states of the column address signals AD0 and AD1, the NAND circuit NAND1 outputs a high-level signal. As a result, the PMOS transistors MP1 and MP2 included in the memory cell power supply circuit 20 are turned on and off, respectively, and therefore, all the memory cell power supplies VDDM0 and VDDM1 output a power supply VDD-level signal.

During write operation, when a word line becomes active, the write control signal WEN goes high (active). At this time, either of the column address signals AD0 and AD1 is high. For example, when data is written to the memory cell 10 connected to the word line WLx and the bit lines BL0 and /BL0 (the upper left memory cell of FIG. 10), the column address signal AD0 is high and the column address signal AD1 is low.

Therefore, the NAND circuit NAND1 which receives the column address signal AD0 outputs a low-level signal. The PMOS transistors MP1 and MP2 of the memory cell power supply circuit 20 are turned off and on, respectively, and therefore, the potential of the memory cell power supply VDDM0 decreases from the power supply VDD level to the absolute value |Vtp| of the threshold voltage of the PMOS transistor MP2. When the potential of the memory cell power supply VDDM0 becomes |Vtp|, the PMOS transistor MP2 is turned off. Because the PMOS transistors MP1 and MP2 are both turned off, a current does not flow through the memory cell power supply circuit 20.

In contrast to this, the memory cell power supply VDDM1 for memory cells 10 connected to the bit lines BL1 and /BL1 on which write operation is not performed is at the power supply VDD level which is a potential immediately before the write control signal WEN goes high and the PMOS transistor MP1 is then turned off, and is in the high-impedance state. Although, in the first embodiment, the memory cell power supply VDDM1 is at the power supply VDD level and in the low-impedance state, the third embodiment provides substantially the same operation as that of the first embodiment. It is not necessary to decrease, from the power supply VDD level, the memory cell power supply for memory cells 10 connected to bit lines on which write operation is not performed. A problem does not arise even when the memory cell power supply for memory cells 10 connected to bit lines on which write operation is not performed is decreased from the power supply VDD level. In this case, however, an unwanted charge or discharge current occurs in the memory cell power supply. Therefore, as in the above configuration, the memory cell power supply should be controlled to substantially the same level as the power supply VDD level.

As described above, the semiconductor storage device of this embodiment of FIG. 10 performs substantially the same operation as that of the first embodiment of FIG. 1, and therefore, has substantially the same effects as those of the first embodiment.

In this embodiment, during write operation, the memory cell power supply VDDM1 for memory cells 10 connected to the bit lines BL1 and /BL1 on which write operation is not performed is in the high-impedance state. In other words, in this embodiment, the memory cell power supply for memory cells connected to bit lines on which write operation is not performed is interrupted (high-impedance state), unwanted power consumption is reduced or eliminated. Therefore, power consumption is further reduced compared to the semiconductor storage device of the first embodiment.

In this embodiment, the inverter circuit INV1 of the first embodiment of FIG. 1 is not required. Therefore, the area of the layout of the semiconductor storage device can be further reduced compared to the first embodiment.

Needless to say, also in the second and third embodiments, operation and modifications similar to those of the first embodiment can be made.

As described above, in the semiconductor storage device of the present disclosure, during write operation, when a memory cell power supply is decreased so that the write characteristics of a memory cell are improved, current consumption in a unit for generating the memory cell power supply is reduced, and the memory cell power supply does not become lower than the retention voltage of the memory cell. Therefore, data in the memory cell can be reliably stored or held without destruction of the memory cell data. Thus, the semiconductor storage device of the present disclosure has improved write characteristics.

What is claimed is:

1. A semiconductor storage device comprising:
   a plurality of word lines;
   a plurality of bit lines including a first bit line and a second bit line;
   a plurality of memory cells including a plurality of first-column memory cells provided between and connected to the first bit line and the second bit line and connected to the plurality of word lines, respectively; and
   a plurality of memory cell power supply circuits including a first-column memory cell power supply circuit, the first-column memory cell power supply circuit configured to supply a same memory cell power supply to the plurality of first-column memory cells, wherein:
   the first-column memory cell power supply circuit includes a first PMOS transistor, a second PMOS transistor and a first NMOS transistor connected together in series between a first and a second power supply,
   the memory cell power supply is output at a connection point between the first and second PMOS transistors,
   a control signal which is based on a column select signal and a write control signal is input to a gate terminal of the first PMOS transistor and a gate terminal of the first NMOS transistor, and
   a drain terminal of the first NMOS transistor is connected to a gate terminal of the second PMOS transistor.

2. The semiconductor storage device of claim 1, wherein an absolute value of a threshold voltage of the second PMOS transistor is set to be greater than absolute values of threshold voltages of a load transistor and a drive transistor of the plural memory cell cells.

3. The semiconductor storage device of claim 1, wherein a substrate terminal of the second PMOS transistor is connected to a potential which is higher than or equal to a potential of the first power supply.

4. The semiconductor storage device of claim 1, wherein a channel length of the second PMOS transistor is larger than a channel lengths of a load transistor and a drive transistor of one of the plurality of first-column memory cells.

5. The semiconductor storage device of claim 1, wherein a concentration of impurity implanted in a diffusion region of the second PMOS transistor is higher than a concentration of impurity implanted in a diffusion region of a load transistor of one of the plurality of first-column memory cells.

6. The semiconductor storage device of claim 1, further comprising:
   a plurality of bit line precharge circuits connected to the plurality of bit lines, wherein
   the plurality of bit line precharge circuits includes a first-column bit-line precharge circuit connected to the first and second bit lines,
   the first-column bit-line precharge circuit is provided adjacent to a memory cell array region including the plurality of first-column memory cells, and
   the first and second PMOS transistors included in the first-column memory cell power supply circuit are provided in a same substrate region in which the first-column bit line precharge circuit is provided.

7. The semiconductor storage device of claim 1, wherein the write control signal is generated by logical AND of a write determination signal and an inverted version of a signal obtained by delaying the write determination signal.

8. The semiconductor storage device of claim 1, wherein the number of logic stages from a first initial-stage to which a clock signal, which is input to the semiconductor storage device, is input to a first end-stage at which a signal to cause potential of the memory cell power supply to be substantially equal to potential of the first power supply is output, is smaller than the number of logic stages from a second initial-stage to which the clock signal input to a second end-stage at which a signal to cause a word line to be inactive is output.

9. The semiconductor storage device of claim 1, further comprising:
   a first control signal configured to cause the first NMOS transistor to be invariably off.

10. The semiconductor storage device of claim 1, wherein lines each connecting one of the plurality of memory cell power supply circuits and the plural memory cells are parallel with the plurality of bit lines.

11. A semiconductor storage device comprising:
    a plurality of word lines;
    a plurality of bit lines including a first bit line and a second bit line;
    a plurality of memory cells including a plurality of first-column memory cells provided between and connected to the first bit line and the second bit line and connected to the plurality of word lines, respectively; and
    a plurality of memory cell power supply circuits including a first-column memory cell power supply circuit, the first-column memory cell power supply circuit configured to supply a same memory cell power supply to the plurality of first-column memory cells, wherein:
    the first-column memory cell power supply circuit includes a first PMOS transistor, a second PMOS transistor connected together in series between a first and a second power supply,
    the memory cell power supply is output at a connection point between the first and second PMOS transistors,
    a control signal which is based on a write control signal, but not based on a column select signal, is input to a gate terminal of the first PMOS transistor, and
    a control signal which is based on the column select signal and the write control signal is input to a gate terminal of the second PMOS transistor.

12. The semiconductor storage device of claim 11, wherein a substrate terminal of the second PMOS transistor is connected to a potential which is higher than or equal to potential of the first power supply.

13. The semiconductor storage device of claim 11, wherein a channel length of the second PMOS transistor is larger than a channel lengths of a load transistor and a drive transistor of one of the plurality of first-column memory cells.

14. The semiconductor storage device of claim 11, wherein the write control signal is generated by logical AND of a write determination signal and an inverted version of a signal obtained by delaying the write determination signal.

15. The semiconductor storage device of claim 11, wherein the number of logic stages from a first initial-stage to which a clock signal, which is input to the semiconductor storage device, is input to a first end-stage at which a signal to cause potential of the memory cell power supply to be substantially equal to potential of the first power supply is output, is smaller than the number of logic stages from a second initial-stage to which the clock signal input to a second end-stage at which a signal to cause a word line to be inactive is output.

16. The semiconductor storage device of claim 11, further comprising:
   a first control signal configured to cause the first NMOS transistor to be invariably off.

17. A semiconductor storage device comprising:
   a plurality of word lines;
   a plurality of bit lines including a first bit line and a second bit line;
   a plurality of memory cells including a plurality of first-column memory cells provided between and connected to the first bit line and the second bit line and connected to the plurality of word lines, respectively; and
   a plurality of memory cell power supply circuits including a first-column memory cell power supply circuit, the first-column memory cell power supply circuit configured to supply a same memory cell power supply to the plurality of first-column memory cells, wherein:
   the first-column memory cell power supply circuit includes a first PMOS transistor and a second PMOS transistor connected together in series between a first and a second power supply,
   the memory cell power supply is output at a connection point between the first and second PMOS transistors,
   a control signal which is based on a column select signal and a write control signal, is input to a gate terminal of the first PMOS transistor,
   a logically inverted version of the signal input to the gate terminal of the first PMOS transistor is input to a gate terminal of the second PMOS transistor, and
   an absolute value of a threshold voltage of the second PMOS transistor is set to be larger than absolute values of threshold voltages of a load transistor and a drive transistor of one of the plurality of first-column memory cells.

18. A semiconductor storage device comprising:
   a plurality of word lines;
   a plurality of bit lines including a first bit line and a second bit line;
   a plurality of memory cells including a plurality of first-column memory cells provided between and connected to the first bit line and the second bit line and connected to the plurality of word lines, respectively; and
   a plurality of memory cell power supply circuits including a first-column memory cell power supply circuit, the first-column memory cell power supply circuit configured to supply a same memory cell power supply to the plurality of first-column memory cells, wherein:
   the first-column memory cell power supply circuit has a function of causing, during a write operation, a potential of the memory cell power supply to be lower than a potential of the first power supply,
   the semiconductor storage device further includes a leakage current compensation circuit including a MOS transistor connected between the first power supply and the memory cell power supply, and configured to compensate for a leakage current of the memory cell power supply while the potential of the memory cell power supply is caused to be lower than the potential of the first power supply, and
   a channel length of the MOS transistor included in the leakage current compensation circuit is substantially equal to a channel length of a transistor included in one of the plurality of first-column memory cells.

19. The semiconductor storage device of claim 18, further comprising:
   a plurality of bit line precharge circuits connected to the plurality of bit lines, wherein
   the plurality of bit line precharge circuits includes a first-column bit-line precharge circuit connected to the first and second bit lines,
   the first-column bit-line precharge circuit is provided adjacent to a memory cell array region including the plurality of first-column memory cells, and
   the MOS transistor included in the leakage current compensation circuit is provided in a same substrate region in which the first-column bit line precharge circuit is provided.

* * * * *